United States Patent [19]
Jayaraman et al.

[11] Patent Number: 6,147,177
[45] Date of Patent: Nov. 14, 2000

[54] POLYCYCLIC RESIST COMPOSITIONS WITH INCREASED ETCH RESISTANCE

[75] Inventors: Saikumar Jayaraman, Twinsburg; Brian Leslie Goodall, Akron; Larry Funderburk Rhodes, Silver Lake; Robert Adam Shick; Richard Vicari, both of Strongsville, all of Ohio; Robert David Allen, San Jose, Calif.; Juliann Opitz, San Jose, Calif.; Ratnam Sooriyakumaran, San Jose; Thomas Wallow, Union City, both of Calif.

[73] Assignees: The B. F. Goodrich Company, New York; International Business Machines Corporation, Armonk, both of N.Y.

[21] Appl. No.: 09/253,497

[22] Filed: Feb. 19, 1999

Related U.S. Application Data

[60] Provisional application No. 60/075,557, Feb. 23, 1998.
[51] Int. Cl.$^7$ .................................................. C08F 132/08
[52] U.S. Cl. ......................... 526/281; 526/259; 526/270; 526/283; 526/286; 526/332; 526/333; 526/334; 526/313; 526/308; 526/326; 526/172
[58] Field of Search ................................ 526/259, 270, 526/281, 283, 286, 332, 333, 334, 313, 308, 326, 172

[56] References Cited

U.S. PATENT DOCUMENTS

| | | |
|---|---|---|
| 4,355,148 | 10/1982 | Layer et al. . |
| 5,017,727 | 5/1991 | Olivier . |

FOREIGN PATENT DOCUMENTS

| | | |
|---|---|---|
| 0695733 | 2/1996 | European Pat. Off. . |
| 0789278 | 8/1997 | European Pat. Off. . |
| 197 18 288 | 11/1997 | Germany . |
| 9733198 | 9/1997 | WIPO . |
| WO 97/33198 | 9/1997 | WIPO . |

OTHER PUBLICATIONS

Boyd, T. J. et al; "Electroluminescence From New Polynorbornenes That Contain Blue–Light–Emitting and Charge–Transport Side Chains", *Macromolecules,* vol. 30, No. 12, Jun. 16, 1997, pp. 3553–3559.

Weck, M., et al.; "Synthesis of Discotic Columnar Side–chain Liquid Crystalline Polymers by Ring–Opening Metathesis Polymerization (ROMP)"; *Macromolecules,* vol. 30, No. 21, Oct. 20, 1997, pp. 6430–6437.

Winkler, B., et al.; "Side–Chain Liquid Crystal Polymers of 2,3–disubstituted Norbornenes Via Ring–Opening Metathesis Polymerization, 2 Methoxybiphenyl as Mesogenic Group, Influence of Flexible Spacer Length m=4 to 10 on the Thermotropic Behaviour"; *Macromolecular Chemistry and Physics,* vol. 197, No. 7, Jul. 1, 1996, pp. 2343–2357.

Komiya, Z., et al.; "Synthesis of Side Chain Liquid Crystal Polymers by Living Ring–Opening Metathesis Polymerization. 4. Synthesis of AB Block Copolymers Containing Amorphous and Side Chain Liquid Crystal Blocks"; *Macromolecules,* vol. 26, No. 6, Mar. 15, 1993, pp. 1387–1392.

*Chemical Abstracts,* vol. 84, No. 24, Jun. 14, 1976, Abstract No. 165412h, p. 17, Col. 1.

*Chemical Abstracts,* vol. 84, No. 22, May 31, 1976, Abstract No. 151261W, p. 21, Col. 1.

*Patent Abstracts of Japan,* vol. 013, No. 061 (C–567), Feb. 10, 1989; JP 63 251423, OCt. 18, 1988.

*Patent Abstracts of Japan,* vol. 095, No. 008, Sep. 29, 1995, JP 07 118172, May 9, 1995.

Database WPI, Section Ch, Week 9215, Derwent Publications Ltd., London, GB; AN 92–120182, JP 04 063810, Feb. 28, 1992.

*Primary Examiner*—David W. Wu
*Assistant Examiner*—R. Harlan
*Attorney, Agent, or Firm*—Thoburn T. Dunlap

[57] ABSTRACT

Polycyclic polymers containing pendant aromatic moieties are disclosed. The polymers exhibit light transparency properties to deep UV wave lengths making them useful for high resolution photolithographic applications. These polymers are particularly useful in chemically amplified positive and negative tone resists.

13 Claims, No Drawings

POLYCYCLIC RESIST COMPOSITIONS WITH INCREASED ETCH RESISTANCE

This application claims the benefit of U.S. Provisional No. 60/075,557 filed Feb. 23, 1998.

BACKGROUND OF THE INVENTION

Technical Field

The present invention is generally related to a photoresist composition used in the manufacture of integrated circuits (IC's). More particularly, the invention relates to a polycyclic chemically amplified polymer resist that has light absorbing properties at deep ultraviolet (DUV) wave lengths.

Trends in the electronics industry continually require IC's that are faster and consume less energy. To meet these specifications the IC must be of a high density having sub-micron feature dimensions. Conducting lines must be made thinner and placed closer together. Reducing the spacing between conducting lines results in a concomitant increase in the efficiency of the IC enabling a greater storage capacity and faster processing of information on a computer chip. To achieve thinner line widths and smaller feature sizes higher patterning resolution is necessary.

In the manufacture of IC elements a chemically amplified photoresist is applied on the surface of a silicon wafer. A latent photo lithographic image is formed on the resist by irradiating its surface through an overlying photomask containing the desired patterning information. The exposed areas of the resist undergo a chemical change with attendant changes in solubility. The patterned resist is then developed in a solvent that selectively removes either the exposed or unexposed regions of the resist exposing the underlying wafer. Accordingly, the resist produces positive or negative images of the mask, depending upon the selection of developer solvent. The exposed silicon wafer substrate material is removed or changed by an etching process leaving the desired pattern in a functional layer of the wafer. The remaining resist material functions as a barrier Etching generally involves passing a gas through a chamber and ionizing the gas by applying a potential across two electrodes in the presence of the gas. The plasma containing the ionic species generated by the potential is used to etch a substrate placed in the chamber. The ionic species generated in the plasma are directed to the patterned substrate where they interact with the surface material forming volatile products that are removed from the surface. Reactive ion etching (RIE) provides well defined vertical sidewall profiles in the substrate as well as substrate to substrate etching uniformity. Because of these advantages, the reactive ion etching technique has become the standard in IC manufacture.

To achieve the finer feature sizes demanded by today's specifications, higher photo lithographic imaging resolution is necessary. Higher resolution is possible with shorter wave lengths of the source employed to irradiate the photoresist (DUV at 190 to 315 nm). However, the prior art photoresists such as the phenol-formaldehyde novolac polymers and the substituted styrenic polymers contain aromatic groups that inherently become increasingly absorptive as the wave length of light falls below about 300 nm. A drawback is that the radiation can not fully penetrate the lower portions of the resist. Consequently, the surface portions of the resist receive a much larger dose of radiation than the lower portions. When the irradiated pattern is developed, a tapered profile is formed. Accordingly, fine feature resolution can not be attained. To overcome these transparency deficiencies it has been suggested to decrease the thickness of the resist in the hopes of increasing the transparency characteristics of the resist. However, as is common in the polymer art, the enhancement of one property is usually accomplished at the expense of another. Because photoresist materials are generally organic in nature and the substrates utilized in the manufacture of IC's are typically inorganic (e.g., silicon), the photoresist material has an inherently higher etch rate than the substrate material when employing the RIE process. With thinner layers of resist materials employed to overcome the transparency problem, the resist materials were eroded away before the underlying substrate could be fully etched.

U.S. Pat. No. 5,625,020 to Breyta et al. discloses a chemically amplified resist composition including a polymer comprising the reaction product of hydroxstyrene with acrylate, methacrylate, or mixtures thereof. Acrylate polymers have been proposed to overcome the transparency drawbacks of the phenolic-based photoresists. However, the gain in transparency to shorter wave length UV is achieved at the expense of sacrificing the resists' resistance to RIE processes.

J. V. Crivello et al. (Chemically Amplified Electron-Beam Photoresists, *Chem. Mater.*, 1996, 8, 376–381) describe a polymer blend comprising 20 weight percent of a free radically polymerized homopolymer of a norbornene monomer bearing acid labile groups and 80 weight percent of a homopolymer of 4-hydroxy-α-methylstyrene containing acid labile groups for use in electron-beam photoresists. As discussed supra, the increased absorbity (especially in high concentrations) of aromatic groups renders these compositions opaque and unusable for short wave length imaging radiation below 200 nm. The disclosed compositions are suitable only for electron-beam photoresists and can not be utilized for deep UV imaging (particularly not for 193 nm resists). Crivello et al. investigated blend compositions because they observed the oxygen plasma etch rate to be unacceptably high for free radically polymerized homopolymers of norbornene monomers bearing acid labile groups.

International Patent Application WO 97/33198 to The B. F. Goodrich Company discloses a chemically amplified photoresist composition comprising a polycyclic polymer containing repeating units having pendant acid labile groups. While a variety of other pendant groups are disclosed, no aromatic groups are included. In fact, the Background of the Invention states that "If deep UV transparency is desired (i.e., for 248 nm and particularly 193 nm wave length exposure), the polymer should contain a minimum of aromatic character."

Accordingly, there is still a need for a photoresist composition which is compatible with the general chemical amplification scheme and provides transparency to short wave length imaging radiation while being sufficiently resistant to a reactive ion etching processing environment.

SUMMARY OF THE INVENTION

It is a general object of the invention to provide a photoresist composition comprising a polycyclic polymer composition that is transparent to short wave length imaging radiation and resistance to dry etching processes.

It is a further object of the invention to provide polycyclic polymer having recurrent pendant aromatic groups.

It is a still further object of the invention to provide a method for making polycyclic polymers with pendant aromatic groups.

It is another object of the invention to provide positive and negative tone resists.

These and other objects of the invention are accomplished by providing a cyclic polymer for use in positive and negative tone resist compositions. The polymer is obtained by polymerizing a polycyclic monomer containing protected pendant hydroxyl substituted aromatic groups. Surprisingly the polymer compositions are transparent to DUV and exhibit excellent RIE resistance.

DETAILED DESCRIPTION OF THE INVENTION

The present invention relates to a resist composition comprising a polycyclic polymer containing recurring pendant aromatic groups along the polymer backbone. In one aspect of the invention, the present polymers are prepared by polymerizing a reaction medium comprising one or more aromatic substituted polycyclic monomers set forth under Formula I. In another aspect of the invention, one or more of the monomers of Formula I can be copolymerized with monomers selected from Formula II, Formula III, Formula IV, and mixtures thereof. The monomers of Formulae I to IV are described hereinbelow.

Monomers

The polycyclic monomers containing the pendant aromatic substituents are represented by Formula I below:

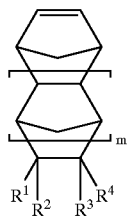

I $R^1$ to $R^4$ independently represent hydrogen, —(CH$_2$)C(O)OR, wherein R is hydrogen or linear and branched (C$_1$ to C$_{10}$) alkyl and at least one of $R^1$ to $R^4$ must be selected from the following aromatic containing substituents: —G, —(CH$_2$)$_n$G, —C(O)O(CH$_2$)$_n$G, —C(O)NH(CH$_2$)$_n$G, —(CH$_2$)$_n$OG, —(CH$_2$)$_n$OC(O)O(CH$_2$)$_n$G, —(CH$_2$)$_n$NHC(O)G; m is an integer of 0 to 5, preferably 0 or 1; n independently represents an integer of 0 to 5; and G is an aromatic group selected from the following moieties:

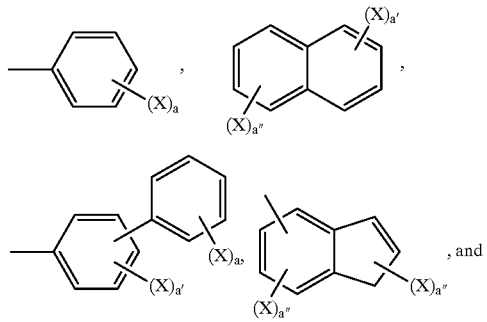

-continued

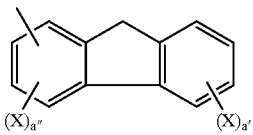

wherein X independently represents OR$^{14}$ or R$^{15}$. As illustrated here and throughout this specification, it is to be understood that the unsubstituted bond lines projecting from the cyclic structures and/or formulae represent the points at which the carbocyclic atoms are bonded to the adjacent molecular moieties defined in the respective formulae. As is conventional in the art, the diagonal orientation of the bond lines projecting from the center of the rings indicate that the bond is optionally connected to any one of the carbocyclic atoms in the ring; a, a' and a" represent the number of times substituent X is substituted on the ring system, wherein a is an integer from 1 to 5, a' is an integer from 1 to 4, and a" is an integer from 1 to 3; $R^{14}$ is hydrogen, linear and branched (C$_1$ to C$_{10}$) alkyl, —C(O)CH$_3$, tetrahydropyranyl, t-butyl; and $R^{15}$ is hydrogen; a halogen atom selected from bromine, chlorine, fluorine, and iodine; cyano, and the group —C(O)O-t-butyl.

In Formula I $R^1$ and $R^4$ together with the two ring carbon atoms to which they are attached can form an aromatic group of 6 to 14 carbon atoms such as phenyl, naphthyl, and anthracenyl or a 5 membered heterocyclic group containing at least one heteroatom wherein the heteroatom is substituted with G as defined above. The aromatic groups of 6 to 14 carbon atoms can be substituted by X as defined above. Representative monomers wherein $R^1$ and $R^4$ taken together form an aromatic or heterocyclic ring are set forth below:

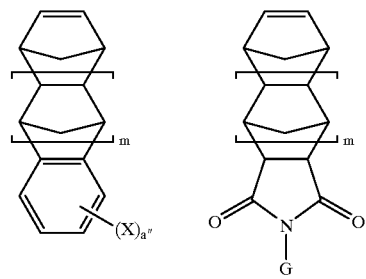

Representative monomers set forth under Formula I are illustrated below:

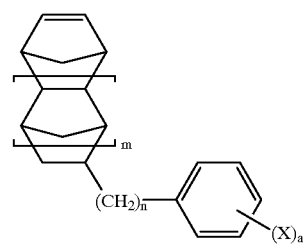

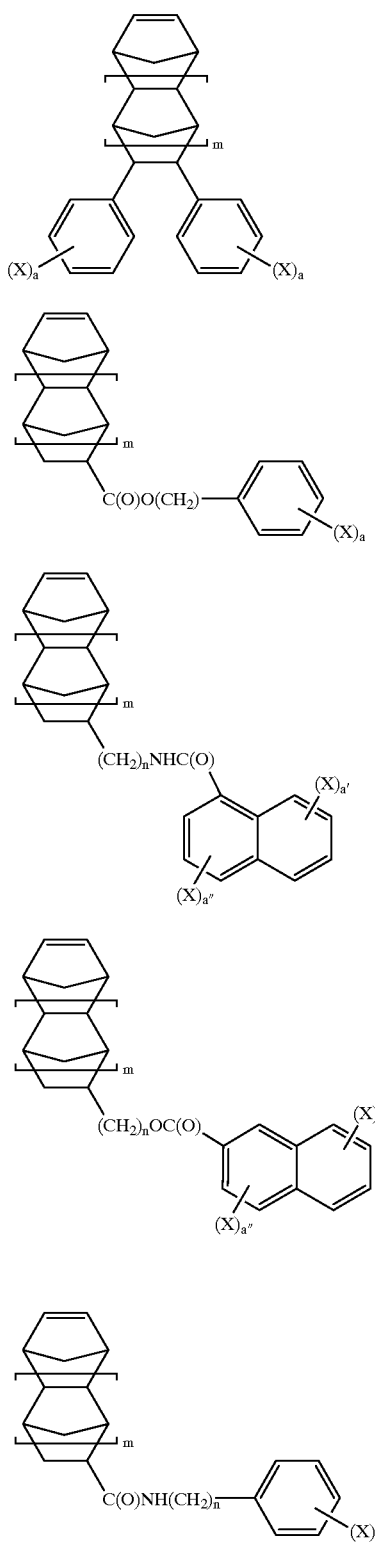

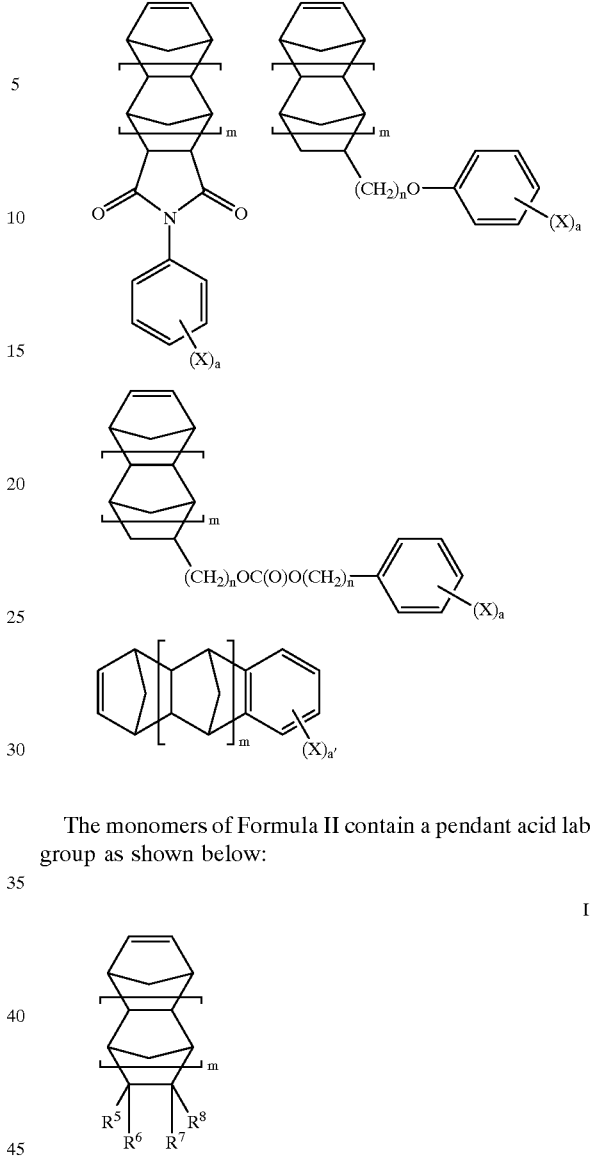

The monomers of Formula II contain a pendant acid labile group as shown below:

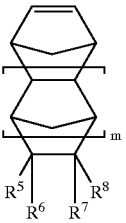

II wherein $R^5$ to $R^8$ independently represent a substituent selected from the group —$(A)_n$C(O)OR*, —$(A)_n$—C(O)OR, —$(A)_n$—OR, —$(A)_n$—OC(O)R, —$(A)_n$—C(O)R, —$(A)_n$—OC(O)OR, —$(A)_n$—OCH$_2$C(O)OR*, —$(A)_n$—C(O)O—A'—OCH$_2$C(O)OR*, —$(A)_n$—OC(O)—A'—C(O)OR*, —$(A)_n$—C(R)$_2$CH(R)(C(O)OR), and —$(A)_n$—C(R)$_2$CH(C(O)OR)$_2$ subject to the proviso that at least one of $R^5$ to $R^8$ is selected from an acid labile group containing R*, preferably, —$(A)_n$C(O)OR*; m is an integer from 0 to 5, preferably 0 or 1.

A and A' independently represent a divalent bridging or spacer radical selected from divalent hydrocarbon radicals, divalent cyclic hydrocarbon radicals, divalent oxygen containing radicals, and divalent cyclic ethers and cyclic diethers, and n is an integer of 0 or 1. When n is 0 it should be apparent that A represents a single covalent bond. By divalent is meant that a free valence at each terminal end of the radical are attached to two distinct groups. The divalent hydrocarbon radicals can be represented by the formula —$(C_dH_{2d})$— where d represents the number of carbon atoms in the alkylene chain and is an integer from 1 to 10. The divalent hydrocarbon radicals are preferably selected from linear and branched ($C_1$ to $C_{10}$) alkylene such as methylene, ethylene, propylene, butylene, pentylene, hexylene, heptylene, octylene, nonylene, and decylene. When branched alkylene radicals are contemplated, it is to be understood that a hydrogen atom in the linear alkylene chain is replaced with a linear or branched ($C_1$ to $C_5$) alkyl group.

The divalent cyclic hydrocarbon radicals include substituted and unsubstituted ($C_3$ to $C_8$) cycloaliphatic moieties represented by the formula:

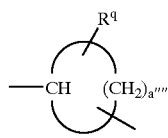

wherein a"" is an integer from 2 to 7 and $R^q$ when present represents linear and branched ($C_1$ to $C_{10}$) alkyl groups. Preferred divalent cycloalkylene radicals include cyclopentylene and cyclohexylene moieties represented by the following structures:

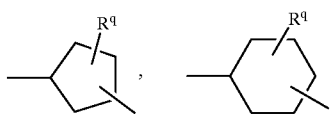

wherein $R^q$ is defined above.

Preferred divalent cyclic ethers and diethers are represented by the structures:

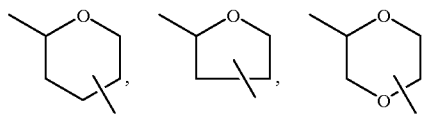

The divalent oxygen containing radicals include ($C_2$ to $C_{10}$) alkylene ethers and polyethers. By ($C_2$ to $C_{10}$) alkylene ether is meant that the total number of carbon atoms in the divalent ether moiety must at least be 2 and can not exceed 10. The divalent alkylene ethers are represented by the formula -alkylene-O-alkylene- wherein each of the alkylene groups that are bonded to the oxygen atom can be the same or different and are selected from methylene, ethylene, propylene, butylene, pentylene, hexylene, heptylene, octylene, and nonylene. The simplest divalent alkylene ether of the series is the radical —$CH_2$—O—$CH_2$—. Preferred polyether moieties include divalent radicals of the formula:

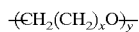

wherein x is an integer from 1 to 5 and y is an integer from 2 to 50 with the proviso that the terminal oxygen atom on the polyether spacer moiety can not be directly linked to a terminal oxygen atom on an adjacent group to form a peroxide linkage. In other words, peroxide linkages (i.e., —O—O—) are not contemplated when polyether spacers are linked to any of the terminal oxygen containing substituent groups set forth under $R^5$ to $R^8$ above.

In the above formulae R represents hydrogen and linear and branched ($C_1$ to $C_{10}$) alkyl, and R* represents moieties (i.e., blocking or protecting groups) that are cleavable by photoacid initiators selected from —$C(CH_3)_3$, —$CH(R^P)OCH_2CH_3$, —$CH(R^P)OC(CH_3)_3$, or the following cyclic groups:

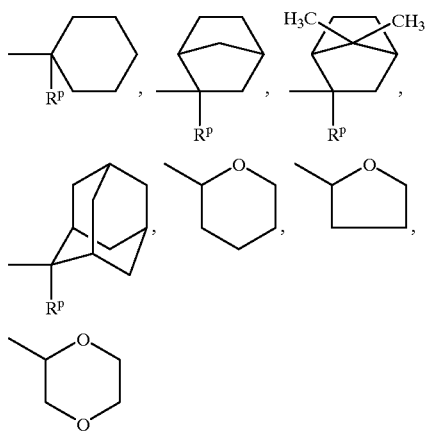

wherein $R^P$ represents hydrogen or a linear or branched ($C_1$ to $C_5$) alkyl group. The alkyl substituents include methyl, ethyl, propyl, i-propyl, butyl, i-butyl, t-butyl, pentyl, t-pentyl and neopentyl. In the above structures, the single bond line projecting from the cyclic groups indicates the carbon atom ring position where the protecting group is bonded to the respective substituent. Examples of acid labile groups include 1-methyl-1-cyclohexyl, isobornyl, 2-methyl-2-isobornyl, 2-methyl-2-adamantyl, tetrahydrofuranyl, tetrahydropyranyl, 3-oxocyclohexanonyl, mevalonic lactonyl, 1-ethoxyethyl, 1-t-butoxy ethyl, dicyclopropylmethyl (Dcpm), and dimethylcyclopropylmethyl (Dmcp) groups. R** independently represents R and R* as defined above. The Dcpm and Dmcp groups are respectively represented by the following structures:

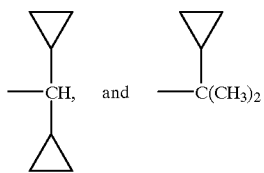

Polycyclic monomers of the above formula with a substituent selected from the group —$(CH_2)_nC(R)_2CH(R)(C(O)OR^{})$ or —$(CH_2)_nC(R)_2CH(C(O)OR^{})_2$ can be represented as follows:

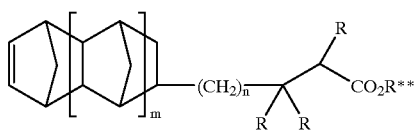

-continued

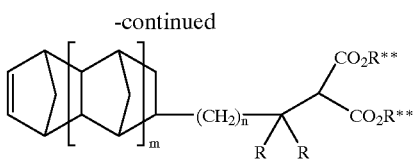

wherein m is as defined in Formula I above and n is an integer from 0 to 10.

It should be apparent to those skilled in the art that any photoacid cleavable moiety is suitable in the practice of the invention so long as the polymerization reaction is not substantially inhibited by same.

The monomers of Formula III contain pendant neutral or polar substituents as illustrated below:

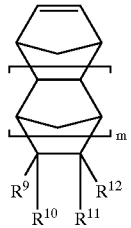

III wherein $R^9$ to $R^{12}$ independently represent a neutral or polar substituent selected from the group: —$(A)_n$—C(O)OR", —$(A)_n$—OR", —$(A)_n$—OC(O)R", —$(A)_n$—OC(O)OR", —$(A)_n$—C(O)R", —$(A)_n$—OC(O)C(O)OR", —$(A)_n$—O—A'—C(O)OR", —$(A)_n$—OC(O)—A'—C(O)OR", —$(A)_n$—C(O)O—A'—C(O)OR", —$(A)_n$—C(O)—A'—OR", —$(A)_n$—C(O)O—A'—OC(O)OR", —$(A)_n$—C(O)O—A'—O—A'—C(O)OR", —$(A)_n$—C(O)O—A'—OC(O)C(O)OR", —$(A)_n$—C(R")$_2$CH(R")(C(O)OR"), and —$(A)_n$—C(R")$_2$CH(C(O)OR")$_2$; and m is an integer from 0 to 5, preferably 0 or 1. The moieties A and A' independently represent a divalent bridging or spacer radical selected from divalent hydrocarbon radicals, divalent cyclic hydrocarbon radicals, divalent oxygen containing radicals, and divalent cyclic ethers and cyclic diethers, and n is an integer 0 or 1. When n is 0 it should be apparent that A represents a single covalent bond. By divalent is meant that a free valence at each terminal end of the radical are attached to two distinct groups. The divalent hydrocarbon radicals can be represented by the formula —$(C_dH_{2d})$— where d represents the number of carbon atoms in the alkylene chain and is an integer from 1 to 10. The divalent hydrocarbon radicals are preferably selected from linear and branched ($C_1$ to $C_{10}$) alkylene such as methylene, ethylene, propylene, butylene, pentylene, hexylene, heptylene, octylene, nonylene, and decylene. When branched alkylene radicals are contemplated, it is to be understood that a hydrogen atom in the linear alkylene chain is replaced with a linear or branched ($C_1$ to $C_5$) alkyl group.

The divalent cyclic hydrocarbon radicals include substituted and unsubstituted ($C_3$ to $C_8$) cycloaliphatic moieties represented by the formula:

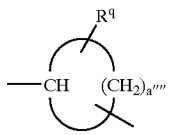

wherein a"" is an integer from 2 to 7 and $R^q$ when present represents linear and branched ($C_1$ to $C_{10}$) alkyl groups. Preferred divalent cycloalkylene radicals include cyclopentylene and cyclohexylene moieties represented by the following structures:

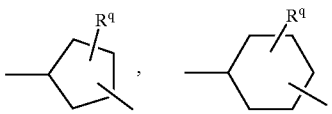

wherein $R^q$ is defined above.

Preferred divalent cyclic ethers and diethers are represented by the structures:

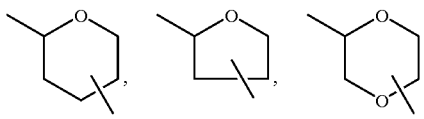

The divalent oxygen containing radicals include ($C_2$ to $C_{10}$) alkylene ethers and polyethers. By ($C_2$ to $C_{10}$) alkylene ether is meant that the total number of carbon atoms in the divalent ether moiety must at least be 2 and can not exceed 10. The divalent alkylene ethers are represented by the formula -alkylene-O-alkylene- wherein each of the alkylene groups that are bonded to the oxygen atom can be the same or different and are selected from methylene, ethylene, propylene, butylene, pentylene, hexylene, heptylene, octylene, and nonylene. The simplest divalent alkylene ether of the series is the radical —$CH_2$—O—$CH_2$—. Preferred polyether moieties include divalent radicals of the formula:

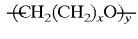

wherein x is an integer from 1 to 5 and y is an integer from 2 to 50 with the proviso that the terminal oxygen atom on the polyether spacer moiety can not be directly linked to a terminal oxygen atom on an adjacent group to form a peroxide linkage. In other words, peroxide linkages (i.e., —O—O—) are not contemplated when polyether spacers are linked to any of the terminal oxygen containing substituent groups set forth under $R^9$ to $R^{12}$ above.

$R^9$ to $R^{12}$ can also independently represent hydrogen, linear and branched ($C_1$ to $C_{10}$) alkyl, so long as at least one of the remaining $R^9$ to $R^{12}$ substituents is selected from one of the neutral or polar groups represented above. R" independently represents hydrogen, linear and branched ($C_1$ to $C_{10}$) alkyl, linear and branched ($C_1$ to $C_{10}$) alkoxyalkylene, polyethers, monocyclic and polycyclic ($C_4$ to $C_{20}$) cycloaliphatic moieties, cyclic ethers, cyclic ketones, and cyclic esters (lactones). By ($C_1$ to $C_{10}$) alkoxyalkylene is meant that a terminal alkyl group is linked through an ether oxygen atom to an alkylene moiety. The radical is a hydrocarbon based ether moiety that can be generically represented as -alkylene-O-alkyl wherein the alkylene and alkyl groups independently contain 1 to 10 carbon atoms each of which can be linear or branched. The polyether radical can be represented by the formula:

wherein x is an integer from 1 to 5, y is an integer from 2 to 50 and $R^a$ represents hydrogen or linear and branched ($C_1$ to $C_{10}$) alkyl. Preferred polyether radicals include poly(ethylene oxide) and poly(propylene oxide). Examples of monocyclic cycloaliphatic monocyclic moieties include cyclopropyl, cyclobutyl, cyclopentyl, cyclohexyl, and the like. Examples of cycloaliphatic polycyclic moieties include, norbornyl, adamantyl, tetrahydrodicyclopentadienyl (tricyclo[5.2.1.0$^{2.6}$]decanyl), and the like. Examples of cyclic ethers include tetrahydrofuranyl and tetrahydropyranyl moieties. An example of a cyclic ketone is a 3-oxocyclohexanonyl moiety. An example of a cyclic ester or lactone is a mevalonic lactonyl moiety. $R^9$ and $R^{12}$ can be taken together with the ring carbon atoms to which they are attached to represent a cyclic anhydride group as shown below:

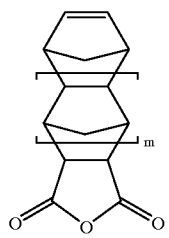

wherein m is as defined above.

The monomers of Formula IV include a pendant hydrocarbyl substituent as set forth in the formula below:

IV

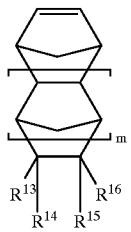

wherein $R^{13}$ to $R^{16}$ independently represent hydrogen or linear or branched ($C_1$ to $C_{10}$) alkyl and m is an integer from 0 to 5, preferably 0 or 1. Of the above alkyl substituents, decyl is especially preferred. The polymerization of alkyl substituted monomers into the polymer backbone is a method to control the Tg of the polymer as disclosed in U.S. Pat. No. 5,468,819 to Goodall et al.

There are several routes to polymerize the polycycloolefin monomers of the invention including: (1) ring-opening metathesis polymerization (ROMP); (2) ROMP followed by hydrogenation; and (3) addition polymerization. Each of the foregoing routes produces polymers with specific structures as shown in the diagram below:

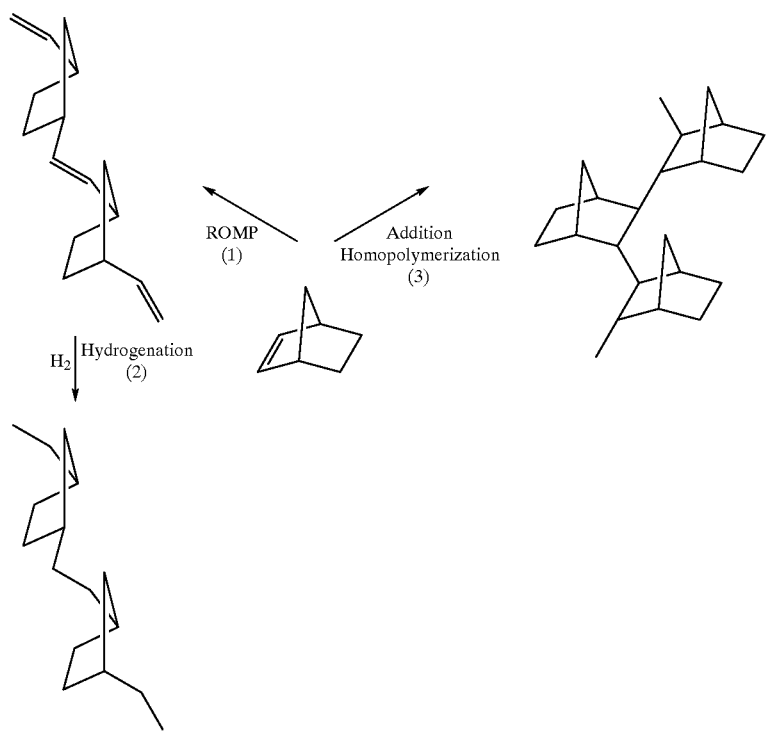

A ROMP polymer has a different structure than that of an addition polymer. A ROMP polymer contains a repeat unit with one less cyclic unit than did the starting monomer. The repeat units are linked together in an unsaturated backbone as shown above. Because of this unsaturation the polymer preferably should subsequently be hydrogenated to confer oxidative stability to the backbone. Addition polymers on the other hand have no C=C unsaturation in the polymer backbone despite being formed from the same monomer.

The monomers of this invention can be polymerized by addition polymerization and by ring-opening metathesis polymerization (ROMP), preferably, with subsequent hydrogenation. The cyclic polymers of the present invention are represented by the following structures:

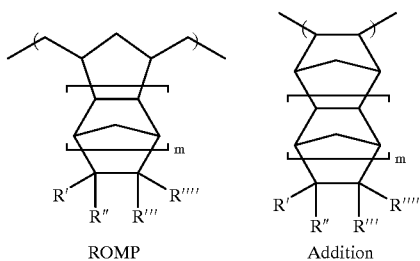

ROMP    Addition wherein R' to R"" independently represent $R^1$ to $R^{16}$ as defined in Formulae I to IV above, m is an integer from 0 to 5 and a represents the number of repeating units in the polymer backbone.

Catalysts

The ROMP polymers of the present invention are polymerized in the presence of a metathesis ring-opening polymerization catalyst in an appropriate solvent. Methods of polymerizing via ROMP and the subsequent hydrogenation of the ring-opened polymers so obtained are disclosed in U.S. Pat. Nos. 5,053,471 and 5,202,388 which are incorporated herein by reference.

In one ROMP embodiment the polycyclic monomers of the invention can be polymerized in the presence of a single component ruthenium or osmium metal carbene complex catalyst such as those disclosed in International Patent Application WO 95-US9655. The monomer to catalyst ratio employed should range from about 50:1 to about 5,000:1. The reaction can be conducted in halohydrocarbon solvent such as dichloroethane, dichloromethane, chlorobenzene and the like or in a hydrocarbon solvent such as toluene. The amount of solvent employed in the reaction medium should be sufficient to achieve a solids content of about 5 to about 40 weight percent, with 6 to 25 weight percent solids to solvent being preferred. The reaction can be conducted at a temperature ranging from about 0° C. to about 60° C., with about 20° C. to 50° C. being preferred.

A preferred metal carbene catalyst is bis (tricyclohexylphosphine)benzylidene ruthenium. Advantageously, it has been found that this catalyst can be utilized as the initial ROMP reaction catalyst and as an efficient hydrogenation catalyst to afford an essentially saturated ROMP polymer. No additional hydrogenation catalyst need be employed. Following the initial ROMP reaction, all that is needed to effect the hydrogenation of the polymer backbone is to maintain hydrogen pressure over the reaction medium at a temperature above about 100° C. but lower than about 220° C., preferably between about 150° C. to about 200° C.

The addition polymers of the present invention can be prepared via standard free radical solution polymerization methods that are well-known by those skilled in the art. The monomers of Formulae I to IV can be free radically homopolymerized or copolymerized in the presence of $SO_2$ or maleic anhydride. Free radical polymerization techniques are set forth in the *Encyclopedia of Polymer Science,* John Wiley & Sons, 13, 708 (1988). Generally, the monomers to be polymerized are reacted under elevated temperature of about 50° C. to 100° C. in a suitable solvent such as toluene or THF, with a small amount of free radical catalyst initiator such as benzoyl peroxide.

Alternatively, and preferably, the monomers of this invention are addition polymerized in the presence of a single or multicomponent catalyst system comprising a Group VIII metal ion source (preferably palladium or nickel). Suitable Group VIII metal catalyst systems are disclosed in International Patent Application Publication WO 97/33198 to The B. F. Goodrich Company, the entire disclosure of which is hereby incorporated by reference. Surprisingly, it has been found that the addition polymers so produced possess excellent transparency to deep UV light (down to 193 nm) and exhibit excellent resistance to reactive ion etching.

The preferred polymers of this invention are polymerized from reaction mixtures comprising at least one polycyclic monomer selected from Formulae I, a solvent, a catalyst system containing a Group VIII metal ion source. The catalyst system can be a preformed single component Group VIII metal based catalyst or a multicomponent Group VIII metal catalyst. A single component catalyst system useful in making polymers utilized in this invention is represented by the formula:

$$E_n Ni(C_6F_5)_2$$

wherein n is 1 or 2 and E represents a neutral 2 electron donor ligand. When n is 1, E preferably is a π-arene ligand such as toluene, benzene, and mesitylene. When n is 2, E is preferably selected from diethylether, THF (tetrahydrofuran), and dioxane. The ratio of monomer to catalyst in the reaction medium can range from about 5000:1 to about 50:1 with a preferred ratio of about 2000:1 to about 100:1. The reaction can be run in a hydrocarbon solvent such as cyclohexane, toluene, and the like at a temperature range from about 0° C. to about 70° C., preferably 10° C. to about 50° C., and more preferably from about 20° C. to about 40° C. Preferred catalysts of the above formula are (toluene)bis (perfluorophenyl) nickel, (mesitylene)bis(perfluorophenyl) nickel, (benzene)bis(perfluorophenyl) nickel, bis (tetrahydrofuran)bis(perfluorophenyl) nickel and bis (dioxane)bis(perfluorophenyl) nickel.

Monomer Preparation

An economical route for the preparation of the substituted polycyclic monomers of the invention relies on the Diels-Alder reaction in which cyclopentadiene (CPD) or substituted CPD is reacted with a suitably substituted dienophile at elevated temperatures to form a substituted polycyclic adduct generally shown by the following reaction scheme:

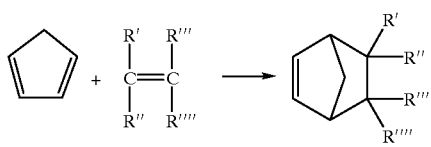

Other polycyclic adducts can be prepared by the thermal pyrolysis of dicyclopentadiene (DCPD) in the presence of a suitable dienophile. The reaction proceeds by the initial pyrolysis of DCPD to CPD followed by the Diels-Alder addition of CPD and the dienophile to give the adducts as shown below:

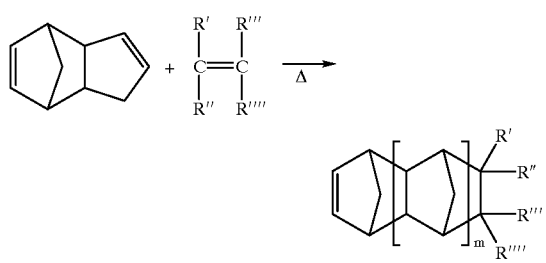

wherein R' to R"" independently represents the substituents defined under $R^1$ to $R^{16}$ in Formulae I to IV above.

For example the diphenyl derivative norbornene can be prepared by the Diels-Alder reaction of cyclopentadiene with substituted stilbene in accordance with the following reaction scheme:

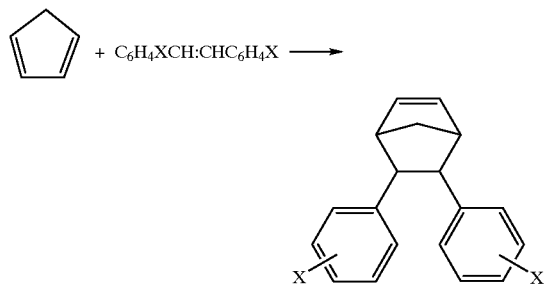

wherein X is a substituent as defined above.

Protecting Groups

When polymerizing the monomers set forth under Formulae I to III wherein $R^1$ to $R^{12}$ is selected from a substituent that contains a hydroxyl moiety, it is preferable (particularly when the Group VIII metal catalysts are employed) to protect the hydroxyl moiety during the polymerization reaction. The protecting group serves to protect the functional group containing the hydroxyl moiety from undesired side reactions or to block its undesired reaction with other functional groups or with the catalysts employed to polymerize the polymer. By hydroxyl moiety is meant any functionality that contains a hydroxyl group. Representative functionalities include, for example, alcohols, carboxylic acids, phenols, and benzoic acid substituents.

Suitable protecting groups include trialkylsilyl groups with trimethylsilyl being preferred. In addition to the trialkylsilyl protective groups, the phenol substituents of the invention can also be protected with an acetate group. The protecting groups described above are introduced into the monomer by techniques well known in the art and are described, for example, in T. W. Green and P. G. M. Wuts, *Protective Groups In Organic Synthesis*, Second Edition, John Wiley & Sons, Inc., New York, 1991. Other protecting groups can be employed so long as they are easily introduced into the monomer, do not interact with the catalyst system so as to inhibit the polymerization reaction, are easily removed from the protected moiety, and do not attack the deprotected moiety. When acid labile monomers of Formula II are employed in the polymer backbone, the protecting group should also be able to be selectively removed by deprotection reagents that do not attack the acid labile groups in the polymer. In other words, the protecting group should have a lower activation energy than the acid labile group to ensure that the protecting group is clipped while the acid labile group remains intact.

Following the synthesis of the polymer containing the desired pendant protected hydroxyl containing moiety, the protected hydroxyl containing moiety is deprotected to yield the alcohol, carboxylic acid or phenol containing functionality. Removal of the protecting groups are well described in the art, for example, see *Protective Groups In Organic Synthesis*, supra.

Repeating units containing pendant protected phenol groups (silyl ethers) can be deprotected by refluxing the polymer containing same in an acidic methanol solution. Trimethylsilyl groups in silyl ether protected groups can be cleaved by mild acids and bases or in the presence of fluoride ion (tetraalkylammonium fluoride). The reaction scheme can be represented as follows:

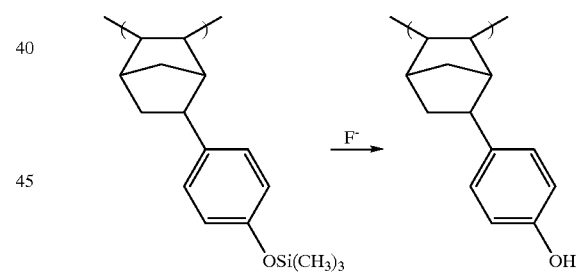

The phenol can also be protected as an phenyl acetate moiety and cleaved to yield the phenol in the presence of aqueous sodium bicarbonate/methanol solution as show below:

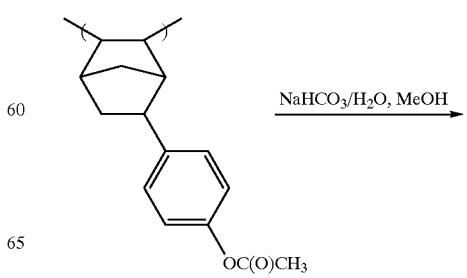

-continued

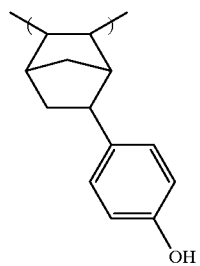

The acetate moiety can also be cleaved in the presence of ammonium hydroxide, or an acidic methanol solution.

Polymers

One or more of the aromatic substituted polycyclic monomers described under Formula I are homopolymerized or copolymerized alone or in combination with one or more of the polycyclic monomers described under Formulae II, III and IV. Accordingly, one aspect of the invention is directed to homopolymers and copolymers comprising random repeating units derived (polymerized) from a monomer or monomers represented by Formula I. In another aspect of the invention copolymers comprising repeating units derived from Formula I and the acid labile containing repeating units of Formula II are contemplated. In still another aspect of the invention polymers comprising repeating units represented by Formula I in optional combination with any repeating unit represented by Formulae II, III, IV and mixtures thereof are contemplated. In addition, the present invention contemplates post-functionalizing homopolymers and copolymers comprising repeating units of Formula I with an acid labile moiety.

The cyclic polymer of the invention will generally comprise about 5 to 100 mole % of a repeating unit derived from a monomer set forth under Formula I, i.e., a monomer containing a hydroxyl substituted aromatic group. For chemically amplified photoresist applications, the polymer must contain at least 10 mole % of repeating units that contain an acid labile group. Preferably the polymer contains about 15 to 100 mole % of a repeating unit having an acid labile group. More preferably the polymer contains about 20 to 40 mole % of a repeating unit that contains the acid labile functionality. The acid labile groups can be introduced into the polymer through the acid labile monomers of Formula II or introduced via the post-functionalization of the hydroxyl substituted aromatic groups in repeating units derived from the monomers set forth under Formula I. The remainder of polymer composition can be made up of repeating units polymerized from the optional monomers set forth above under Formulae III to IV. The choice and the amount of specific monomers employed in the polymer can be varied according to the properties desired. For example, by varying the amount of carboxylic acid functionality in the polymer backbone, the solubility of the polymer to various developing solvents can be adjusted as desired. Monomers containing the ester functionality can be varied to enhance the mechanical properties of the polymer and radiation sensitivity of the system. Finally, the glass transition temperature properties of the polymer can be adjusted by incorporating cyclic repeating units that contain long chain alkyl groups such as decyl.

As discussed above the nature and structure of the cyclic repeating unit in the polymer will vary depending on the catalyst employed in the reaction medium. The single and multicomponent Group VIII transition metal catalysts and the free radical catalysts will yield 2,3 addition polymers comprising repeating units represented as follows:

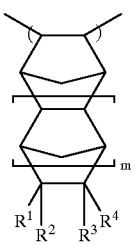

I

In addition, the free radically polymerized polycyclic monomers of Formula I can be copolymerized with other free radically polymerizable monomers such as maleic anhydride or $SO_2$ to yield polymers represented by the structures below:

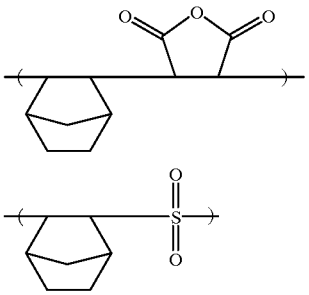

When a monomer of Formula I is polymerized via a ROMP catalyst, a ring-opened polymer comprising ring-opened repeating units is obtained as follows:

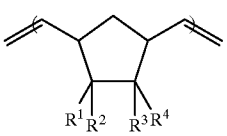

The unsaturation in the polymer backbone can be hydrogenated in the presence of a suitable hydrogenation catalyst to yield a saturated polymer comprising the following repeat unit:

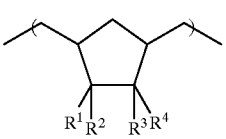

As disclosed above, polymers comprising repeating units that contain aromatic groups can be post-functionalized to introduce acid labile groups onto the aromatic moiety. For example, a hydroxyl containing aromatic group such as a phenol can be post-functionalized with an appropriate acid labile group containing functionalizing agent in the presence of a base (trialkylamine) in THF to yield the acid labile group containing phenyl substituent. Representative reactions are set forth below:

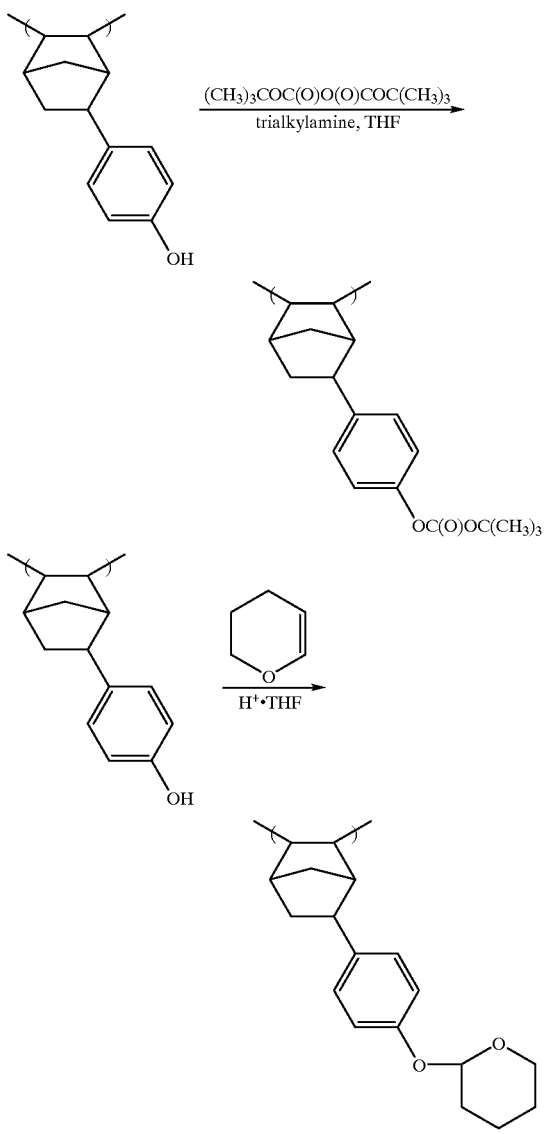

The degree of post-functionalization, i.e., the amount of hydroxyl containing moiety that is converted to and acid labile substituent, can vary as desired. In general up to about 100 mole percent of the pendant hydroxyl containing moieties can be functionalized to the acid labile group containing moiety, preferably from about 10 to about 90 mole percent, more preferably from about 20 to 80 mole percent, and still more preferably about 30 to about 70 mole percent.

Resist Compositions

The polymers of the invention are suitable for use in positive and negative tone photoresist compositions. The positive tone photoresist compositions of the present invention comprise the disclosed polycyclic compositions, a solvent, and an photosensitive acid generator (photoinitiator). In addition to the foregoing components, the negative tone photoresist compositions of the invention include a crosslinking agent. The polymers suitable for use in the negative tone resist compositions of the invention comprise repeating units derived from monomers set forth under Formula I that contain a hydroxyl substituted aromatic group, preferably phenols. These polymers preferably contain from about 5 to about 95 mole percent of repeating units having pendant hydroxyl substituted aromatic groups, more preferably from about 10 to about 60 mole percent, and most preferably from about 15 to about 40 mole percent. The crosslinking agent is a compound which is capable of reacting with the hydroxyl groups on the pendant aromatic moieties on the polymer backbone. The crosslinking agent is activated in the presence of an acid, e.g. the acid generated by the photoacid generators described below.

Suitable crosslinking agents include methylol, alkoxyalkyl and carboxymethyl group substituted phenols, methylol, alkoxyalkyl and carboxymethyl group substituted cyclic ureas; methylol, alkoxyalkyl and carboxymethyl group substituted melamines; and methylol, alkoxyalkyl and carboxymethyl group substituted benzoguanine compounds. The methoxymethyl substituted melamine and cyclic urea compounds shown below are especially preferred.

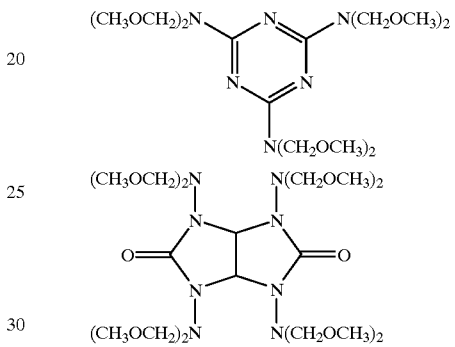

The crosslinking agents are preferably employed in an amount ranging from about 5 to about 95 w/w % of the polymer used in the formulation.

Upon exposure to radiation, the radiation sensitive photoacid generator generates a strong acid. As the resist is heated during processing, the acid effects the catalytic cleavage of the pendant acid labile group from the polymer backbone. The acid is not consumed in the cleavage reaction and subsequently catalyzes additional cleavage reactions thereby chemically amplifying the photochemical response in the resist.

Suitable photoacid generators include triflates (e.g., triphenylsulfonium triflate), pyrogallol (e.g. trimesylate of pyrogallol); onium salts such as triarylsulfonium and diaryliodium hexafluoroantimonates, hexafluoroarsenates, trifluoromethanesulfonates; esters of hydroxyimides, a,a'-bis-sulfonyl-diazomethanes, sulfonate esters of nitro-substituted benzyl alcohols and napthoquinone-4-diazides. Other suitable photoacid initiators are disclosed in Reichmanis et al., Chem. Mater. 3, 395, (1991). Compositions containing triarylsulfonium or diaryliodonium salts are preferred because of their sensitivity to deep UV light (193 to 300 nm) and they give very high resolution images. Most preferred are the unsubstituted and symmetrically or unsymmetrically substituted diaryliodium or triarylsulfonium salts. The photoacid initiator component preferably is employed in an amount ranging from about 1 to 100 w/w % of the polymer. A more preferred concentration range is 5 to 50 w/w % of photoacid generator to polymer.

Optionally, a dissolution inhibitor can be added in an amount of up to about 20 weight % of the composition. A suitable dissolution inhibitor is t-butyl chelate (J. V. Crivello et al., Chemically Amplified Electron-Beam Photoresists, Chem. Mater., 1996, 8, 376–381). In addition, the photoresist compositions of the present invention optionally contain a sensitizer capable of sensitizing the photoacid initiator to longer wave lengths ranging from mid UV to visible light. Depending on the intended application, such sensitizers include polycyclic aromatics such as pyrene and perylene. The sensitization of photoacid initiators is well-known and is described in U.S. Pat. Nos. 4,250,053; 4,371,605; and 4,491,628 which are all incorporated herein by reference. The invention is not limited to a specific class of sensitizer or photoacid initiator.

Also contemplated within the scope of the invention are positive resist compositions comprising the polymers of Formula I that comprise repeating units having pendant hydroxyl substituted aromatic groups and a diazonapthoquinone photosensitizer component. The diazonapthoquinone component functions as dissolution inhibitor in unexposed regions of the resist. Upon irradiation the diazonapthoquinone in the exposed regions of the resist undergoes a chemical rearrangement to form a carboxylic acid. The exposed regions of the resist becomes soluble in basic developers to form a positive resist image.

The present invention also relates to a process for generating a positive and negative tone resist image on a substrate comprising the steps of: (a) coating a substrate with a film comprising the positive or negative tone resist composition of the present invention; (b) imagewise exposing the film to radiation; and (c) developing the image.

The first step involves coating the substrate with a film comprising the positive tone or negative tone resist composition dissolved in a suitable solvent. Suitable substrates are comprised of silicon, ceramics, polymer or the like. Suitable solvents include propylene glycol methyl ether acetate (PGMEA), cyclohexanone, butyrolactate, ethyl lactate, and the like. The film can be coated on the substrate using art known techniques such as spin or spray coating, or doctor blading. Preferably, before the film has been exposed to radiation, the film is heated to an elevated temperature of about 90° C. to 150° C. for a short period of time of about 1 min. In the second step of the process, the film is imagewise exposed to radiation suitably electron beam or electromagnetic preferably electromagnetic radiation such as ultraviolet or x-ray, preferably ultraviolet radiation suitably at a wave length of about 193 to 514 nm preferably about 193 nm to 248 nm. Suitable radiation sources include mercury, mercury/xenon, and xenon lamps, argon fluoride and krypton fluoride lasers, x-ray or e-beam. The radiation is absorbed by the radiation-sensitive acid generator to produce free acid in the exposed area. The free acid catalyzes the cleavage of the acid labile pendant group of the polymer which converts the polymer from dissolution inhibitor to dissolution enhancer thereby increasing the solubility of the exposed resist composition in an aqueous base. In negative tone resist compositions the free acid in combination with the crosslinking agent also effects the crosslinking of the resist polymer containing the hydroxyl substituted aromatic groups.

Preferably, after the film has been exposed to radiation, the film is again heated to an elevated temperature of about 90° C. to 150° C. for a short period of time of about 1 minute.

The third step involves development of the positive or negative tone image with a suitable solvent. Suitable solvents include aqueous base preferably an aqueous base without metal ions such as tetramethyl ammonium hydroxide or choline. The composition of the present invention provides positive images with high contrast and straight walls. Uniquely, the dissolution property of the composition of the present invention can be varied by simply varying the composition of the copolymer.

The present invention also relates to an integrated circuit assembly such as an integrated circuit chip, multichip module, or circuit board made by the process of the present invention. The integrated circuit assembly comprises a circuit formed on a substrate by the steps of: (a) coating a substrate with a film comprising the positive tone resist composition of the present invention; (b) imagewise exposing the film to radiation; (c) developing the image to expose the substrate; and (d) forming the circuit in the developed film on the substrate by art known techniques.

After the substrate has been exposed, circuit patterns can be formed in the exposed areas by coating the substrate with a conductive material such as conductive metals by art known techniques such as evaporation, sputtering, plating, chemical vapor deposition, or laser induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p or n doped circuit transistors. Other means for forming circuits are well known to those skilled in the art.

The following examples are detailed descriptions of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention.

EXAMPLE 1

Synthesis of t-butylester of norbornene/bicyclo(2.2.1) hept-5-ene-2-methyl benzoate copolymer (50/50 mole ratio).

To a glass vial containing a stir bar was added under nitrogen atmosphere 5.4 g (0.024 mol.) of bicyclo(2.2.1) hept-5-ene-2-methyl benzoate, 4.6 g (0.024 mol) of t-butyl ester of norbornene and 65 ml of cyclohexane/ethyl acetate mixture (75/25). To the reaction solution at room temperature was added via syringe a nickel catalyst solution in a monomer to catalyst ratio of 100/1. The catalyst solution was prepared inside a dry box by adding 0.23 g (0.47 mmol) of $(CH_3C_6H_5)Ni(C_6F_5)_2$ in 5 ml of ethyl acetate. The polymerization was allowed to stir for 5 hours after which a solution of 0.13 g of 1,2 cyclohexanedione dioxime dissolved in 5 ml of acetone was added to chelate the Ni catalyst. The chelated Ni complex was observed to precipitate immediately. The solution was stirred overnight, filtered to remove the chelated complex and the filtrate was concentrated and finally poured into acetone to precipitate the polymer. The precipitated polymer was filtered, redissolved in tetrahydrofuran, and treated with Amberlyst® IR-15 dry resin. The resulting polymer solution was concentrated and precipitated into methanol. The polymer was filtered and dried overnight under vacuum. The yield of polymer was 6.89 g (69%). The polymer was further characterized using GPC, IR and NMR. The mol. wt. of the polymer was observed to be Mn=18,000, with a Mw of 42,000. IR clearly indicated the absence of aromatic groups. $^1$H NMR indicated the polymer composition was very close to the initial monomer feed ratio.

EXAMPLE 2

Synthesis of t-butylester of norbornene/bicyclo(2.2.1) hept-5-ene-2-(4-acetoxy)benzene copolymer (30/70 mole ratio).

To a glass vial containing a stir bar was added under nitrogen atmosphere 14.66 g (0.064 mol) of bicyclo(2.2.1)hept-5-ene-2-(4-acetoxy)benzene, 5.35 g (0.027 mol) of t-butyl ester of norbornene and 200 ml toluene. To the reaction solution at room temperature was added via syringe a nickel catalyst solution in a monomer to catalyst ratio of 50/1. The catalyst solution was prepared inside a dry box by adding 0.89 g (1.83 mmol) of $(CH_3C_6H_5)Ni(C_6F_5)_2$ in 8 ml of toluene. The polymerization was allowed to stir for 5 hours after which a solution of 0.52 g of 1,2 cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into acetone to precipitate the polymer. The precipitated polymer was filtered, redissolved in tetrahydrofuran, and treated with Amberlyst® IR-15 dry resin. The resulting polymer solution was concentrated and precipitated into methanol. The polymer was filtered and dried overnight under vacuum. The yield of polymer was 16.65 g (83%). The polymer was further characterized using GPC, IR and NMR. The mol. wt. of the polymer was observed to be Mn=11,500, with a Mw of 28,000. IR clearly indicated the absence of aromatic groups. $^1$H NMR indicated the polymer composition was very close to the initial monomer feed ratio.

EXAMPLE 3

Synthesis of bicyclo(2.2.1)hept-5-ene-2-(4-acetoxy)benzene homopolymer.

To a glass vial containing a stir bar was added under nitrogen atmosphere 20.00 g (0.087 mol) of bicyclo(2.2.1)hept-5-ene-2-(4-acetoxy)benzene, and 200 ml toluene. To the reaction solution at room temperature was added via syringe a nickel catalyst solution in a monomer to catalyst ratio of 50/1. The catalyst solution was prepared inside a dry box by adding 0.85 g (1.75 mmol) of $(CH_3C_6H_5)Ni(C_6F_5)_2$ in 8 ml of toluene. The polymerization was allowed to stir for 5 hours after which a solution of 0.5 g of 1,2 cyclohexanedione dioxime dissolved in 5 ml of acetone was added to chelate the Ni catalyst. The chelated Ni complex was observed to precipitate immediately. The solution was stirred overnight, filtered to remove the chelated complex, and the filtrate was concentrated and finally poured into acetone to precipitate the polymer. The precipitated polymer was filtered, redissolved in tetrahydrofuran, and treated with Amberlyst® IR-15 dry resin. The resulting polymer solution was concentrated and precipitated into methanol. The polymer was filtered and dried overnight under vacuum. The yield of polymer was 17.32 g (87%). The polymer was further characterized using GPC, IR and NMR. The mol. wt. of the polymer was observed to be Mn=13,500, with a Mw of 39,000. IR clearly indicated the absence of aromatic group. $^1$H NMR indicated the polymer composition was very close to the initial monomer feed ratio.

EXAMPLE 4

Synthesis of bicyclo(2.2.1)hept-5-ene-2-(4-hydroxy)benzene homopolymer.

3 grams of the polymer of Example 3 was dissolved in 60 ml of THF/methanol (50/50 by volume). 4 ml of ammonium hydroxide (30%) was added and heated at 60° C. for 18 hours. The deprotection was not complete at this time, as determined by IR spectroscopy. More ammonium hydroxide (4 ml) was added and heated for 6 hours. Afterwards, the solution was allowed to cool to room temperature and added dropwise into 500 ml deionized water containing 10 ml glacial acetic acid. The polymer was filtered, washed with 2 times 25 ml deionized water, and dried under vacuum at 60° C. for 18 hours. Yield: 1.70 grams.

EXAMPLE 5

Positive Resist

The polymer of Example 2 was post-functionalized to convert the pendant phenyl acetate substituent to the phenol in accordance with the procedure set forth in Example 4. The phenol substituted polymer was formulated into a positive resist composition by dissolving the polymer in propylene glycol methyl ether acetate (PGMEA) at 10 weight percent solids content. The resist formulation also contained 2.5 weight percent of bis-t-butylphenyliodonium perfluorobutanesulfonate as a photoacid generator (PAG). The resist composition was spin coated onto a silicon wafer at 2,500 rpm, post-apply baked (PAB) at 90° C. for 1 min., exposed through a mask at 25 mJ/cm$^2$ of nm light, 248 post-expose baked (PEB) at 90° C. for 1 min. The resist was developed in a 0.26N tetramethylammoniumhydroxide (TMAH) solution for 30 sec. The exposed resist development rate was about 3,500 Å/sec. (endpoint in ca. 3 sec.). The thickness change of the unexposed regions of the resist was nearly zero (less than 100 Å). The resist had high dissolution contrast.

The polymer film was very hydrophilic, with a water contact angle of 56°. The neat polymer film dissolves slowly in TMAH developer solutions and is transparent at 248 nm with an absorption of 0.15 μm.

EXAMPLE 6

Negative Resist

The polymer of Example 2 was post-functionalized to convert the pendant phenyl acetate substituent to the corresponding phenol in accordance with the procedure set forth in Example 4. The polymer was insoluble in 0.26N TMAH developer solution suggesting that acetoxy groups were not fully converted to the alcohol. The polymer was dissolved in PGMEA (10 weight percent solids content). The resist formulation contained 15 weight percent of a glycol-ural crosslinker and 3.5 weight percent of triphenylsulonium triflate PAG. The negative resist formulation was spin coated onto a silicon water to form a film and baked (PAB) at 100° C. for 1 min., exposed through a mask to 35 mJ/cm$^2$ of 254 nm light, then baked (PEB) at 100° C. for 1 min. The resist was developed for 30 seconds in a 0.26N TMAH/25% (VN) isopropyl alcohol developer solution. A highly cured insoluble film was produced in the exposed region of the resist, while the unexposed regions cleanly dissolved.

EXAMPLE 7

The polymer obtained in Examples 1 and 3 were compared for ion etch resistance to a commercially available DUV resist, Apex-E (positive polyhydroxystyrene-type resist), available from the Shipley Company, LLC, Marlboro, Mass. Evaluation of polymer RIE resistance was carried out using a polysilicon etch process in an Applied Materials 5000 RIE tool. The tool was configured to provide 500 watts of power to a plasma composition consisting of 106 sccm $C_{12}$ and 124 sccm HBr at a total chamber pressure of 158 mTorr. The cathode temperature was controlled at 50° C. Under production conditions, this process etches approximately 0.33 μm/min. of polysilicon and 0.04 μm/min. of Apex-E, polyhydroxystyrene. Polymer samples were coated to thicknesses between 0.5 and 1.0 μm on 8 in. silicon wafers using standard solution spin coating procedures. The coated wafers were then baked at 140° C. for 1 min. to minimize residual casting solvent. Film thicknesses were determined by ellipsometry and interferometric methods. Films were etched for 150 sec. in radomized lots. Etch results are reported as ratios normalized to the Apex-E standard.

| Polymer of Example | Normalized Etch Rate* AM 5000 Process |
|---|---|
| 1 | 0.91 |
| 3 | 0.65 |

*Normalized against Apex-E (polyhydroxystyrene).

What is claimed is:

1. A cyclic polymer polymerized from a monomer composition containing one or more polycyclic monomers having a pendant aromatic substituent in optional combination with a monomer selected from the group consisting of one or more polycyclic monomers having a pendant acid labile substituent, one or more polycylic monomers having a pendant neutral or polar substituent, one or more monomers having a pendant hydrocarbyl substituent, and combinations thereof, wherein said aromatic substituent containing monomer is represented by the structure:

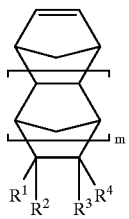

wherein $R^1$ to $R^4$ independently represent hydrogen, —$(CH_2)C(O)OR$, wherein R is hydrogen or linear and branched ($C_1$ to $C_{10}$) alkyl and at least one of $R^1$ to $R^4$ is an aromatic containing substituent selected from the group consisting of —G, —$(CH_2)_nG$, —$C(O)O(CH_2)_nG$, —$C(O)NH(CH_2)_nG$, —$(CH_2)_nOG$, —$(CH_2)_nOC(O)O(CH_2)_nG$, and —$(CH_2)_nNHC(O)G$; m is an integer of 0 to 5; n independently represents an integer of 0 to 5; and G is an aromatic group substituted with at least one substituent selected from the group consisting of —$OR^{14}$, $R^{15}$, and combinations thereof, wherein $R^{14}$ represents hydrogen, linear and branched ($C_1$ to $C_{10}$) alkyl, —$C(O)CH_3$, tetrahydropyranyl, t-butyl; $R^{15}$ represents hydrogen, bromine, chlorine, fluorine, iodine, cyano, and the group —$C(O)O$-t-butyl; $R^1$ and $R^4$ together with the two ring carbon atoms to which they are attached can form a substituted aromatic group of 6 to 14 carbon atoms wherein said substituents are selected from at least one moiety of the formulae —$OR^{14}$ or $R^{15}$ as defined above; $R^1$ and $R^4$ together with the two ring carbon atoms to which they are attached can also form a 5 membered heterocyclic group containing at least one heteroatom wherein the heteroatom is substituted with G as defined above; said acid labile group containing monomer is represented by the structure:

wherein $R^5$ to $R^8$ independently represent a substituent selected from the group —$(A)_nC(O)OR^*$, —$(A)_n$—$C(O)OR$, —$(A)_n$—$OR$, —$(A)_n$—$OC(O)R$, —$(A)_n$—$C(O)R$, —$(A)_n$—$OC(O)OR$, —$(A)_n$—$OCH_2C(O)OR^*$, —$(A)_n$—$C(O)O$—$A'$—$OCH_2C(O)OR^*$, —$(A)_n$—$OC(O)$—$A'$—$C(O)OR^*$, —$(A)_n$—$C(R)_2CH(R)(C(O)OR^{})$, and —$(A)_n$—$C(R)_2CH(C(O)OR^{})_2$ subject to the proviso that at least one of $R^5$ to $R^8$ is selected from an acid labile group containing $R^*$; A and A' independently represent a divalent bridging or spacer radical selected from divalent hydrocarbon radicals selected from linear and branched ($C_1$ to $C_{10}$) alkylene; divalent cyclic hydrocarbon radicals selected from substituted and unsubstituted ($C_3$ to $C_8$) cycloaliphatic moieties of the formula:

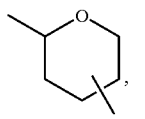

wherein "a" is an integer from 2 to 7 and $R^q$ if present represents linear and branched ($C_1$ to $C_{10}$) alkyl groups; divalent oxygen containing radicals selected from ($C_2$ to $C_{10}$) alkylene ethers and polyethers of the formula:

$$-(CH_2(CH_2)_xO)_y-$$

wherein x is an integer from 1 to 5 and y is an integer from 2 to 50, with the proviso that the terminal oxygen atom on the polyether spacer moiety can not be directly linked to a terminal oxygen atom on an adjacent group to form a peroxide linkage; and divalent cyclic ethers and cyclic diethers represented by the structures:

and $R^*$ is acid labile group selected from Dcpm, Dmcp, —$C(CH_3)_3$, —$CH(R^p)OCH_2CH_3$, —$CH(R^p)OC(CH_3)_3$, and the cyclic group:

-continued

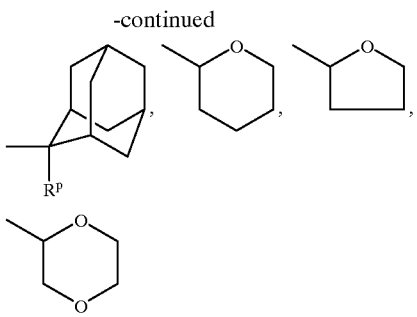

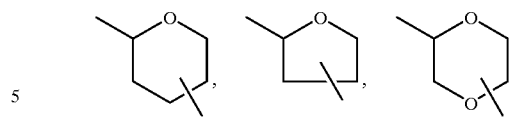

or mixtures thereof, wherein $R^p$ represents hydrogen and a linear or branched ($C_1$ to $C_5$) alkyl group; wherein said neutral or polar group containing monomer is represented by the structure:

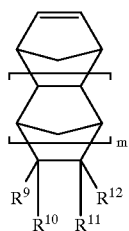

wherein q is an integer from 0 to 5; $R^9$ to $R^{12}$ independently represent hydrogen, linear or branched ($C_1$ to $C_{10}$) alkyl, or a substituent selected from the group —(A)$_n$—C(O)OR", —(A)$_n$—OR", —(A)$_n$—OC(O)R", —(A)$_n$—OC(O)OR", —(A)$_n$—C(O)R", —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$, $R^9$ and $R^{12}$ can be taken together with the ring carbon atoms to which they are attached to represent a cyclic anhydride group; A and A' independently represent a divalent bridging or spacer radical selected from divalent hydrocarbon radicals selected from linear and branched ($C_1$ to $C_{10}$) alkylene; divalent cyclic hydrocarbon radicals selected from substituted and unsubstituted ($C_3$ to $C_8$) cycloaliphatic moieties of the formula:

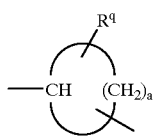

wherein "a" is an integer from 2 to 7 and $R^q$ if present represents linear and branched ($C_1$ to $C_{10}$) alkyl groups; divalent oxygen containing radicals selected from ($C_2$ to $C_{10}$) alkylene ethers and polyethers of the formula:

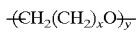

wherein x is an integer from 1 to 5 and y is an integer from 2 to 50, with the proviso that the terminal oxygen atom on the polyether spacer moiety can not be directly linked to a terminal oxygen atom on an adjacent group to form a peroxide linkage; and divalent cyclic ethers and cyclic diethers represented by the structures:

R" independently represents, linear and branched ($C_1$ to $C_{10}$) alkyl, linear and branched ($C_1$ to $C_{10}$) alkoxyalkylene, polyethers, monocyclic and polycyclic ($C_4$ to $C_{20}$) cycloaliphatic moieties, cyclic ethers, cyclic ketones, and cyclic esters; and wherein said hydrocarbyl containing monomer is represented by the structure:

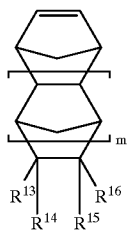

wherein $R^{13}$ to $R^{16}$ independently represent hydrogen and linear and branched ($C_1$ to $C_{10}$) alkyl; and m is an integer from 0 to 5.

2. The polymer of claim 1 wherein said monomers are polymerized by ring-opening polymerization to obtain a ring-opened polymer.

3. The polymer of claim 2 wherein said ring-opened polymer is hydrogenated.

4. The polymer of claim 1 wherein said monomers are polymerized by free radical polymerization.

5. The polymer of claim 1 wherein said monomers are polymerized in the presence of a catalyst selected from a compound of the formula $E_n Ni(C_6F_5)_2$, wherein n is 1 or 2 and E represents a neutral 2 electron donor ligand.

6. The composition of claim 5 wherein said catalyst ligand E is selected from the group consisting of toluene, benzene, mesitylene, diethylether, THF, and dioxane.

7. The polymer of claim 6 wherein said catalyst is selected from the group consisting of (toluene)bis(perfluorophenyl) nickel, (mesitylene)bis(perfluorophenyl) nickel, (benzene) bis(perfluorophenyl) nickel, bis(tetrahydrofuran)bis (perfluorophenyl) nickel and bis(dioxane)bis (perfluorophenyl) nickel.

8. The polymer of claim 1 comprising repeating units represented the structures:

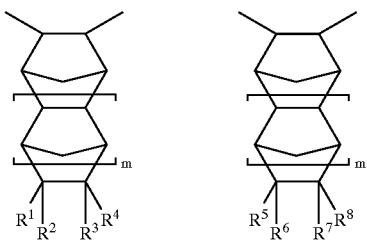

wherein $R^1$ to $R^4$ independently represent hydrogen, —(CH$_2$)C(O)OR, wherein R is hydrogen or linear and branched ($C_1$ to $C_{10}$) alkyl and at least one of $R^1$ to $R^4$ is an aromatic containing substituent selected from the group consisting of —G, —(CH$_2$)$_n$G, —C(O)O(CH$_2$)$_n$G, —C(O)NH(CH$_2$)$_n$G, —(CH$_2$)$_n$OG, —(CH$_2$)$_n$OC(O)O(CH$_2$)$_n$G, and —(CH$_2$)$_n$NHC(O)G; m is an integer of 0 to 5; n independently represents an integer of 0 to 5; and G is an aromatic group substituted with at least one substituent selected from the group consisting of —OR$^{14}$, R$^{15}$, and combinations thereof, wherein R$^{14}$ represents hydrogen, linear and branched (C$_1$ to C$_{10}$) alkyl, —C(O)CH$_3$, tetrahydropyranyl, t-butyl; R$^{15}$ represents hydrogen, bromine, chlorine, fluorine, iodine, cyano, and the group —C(O)O-t-butyl; R$^1$ and R$^4$ together with the two ring carbon atoms to which they are attached can form a substituted aromatic group of 6 to 14 carbon atoms wherein said substituents are selected from at least one moiety of the formulae —OR$^{14}$ or R$^{15}$ as defined above; R$^1$ and R$^4$ together with the two ring carbon atoms to which they are attached can also form a 5 membered heterocyclic group containing at least one heteroatom wherein the heteroatom is substituted with G as defined above; R$^5$ to R$^8$ independently represent a substituent selected from the group —(A)$_n$C(O)OR*, —(A)$_n$—C(O)OR, —(A)$_n$—OR, —(A)$_n$—OC(O)R, —(A)$_n$—C(O)R, —(A)$_n$—OC(O)OR, —(A)$_n$—OCH$_2$C(O)OR*, —(A)$_n$—C(O)O—A'—OCH$_2$C(O)OR*, —(A)$_n$—OC(O)—A'—C(O)OR*, —(A)$_n$—C(R)$_2$CH(R)(C(O)OR), and —(A)$_n$—C(R)$_2$CH(C(O)OR)$_2$ subject to the proviso that at least one of R$^5$ to R$^8$ is selected from an acid labile group containing R*; A and A' independently represent a divalent bridging or spacer radical selected from divalent hydrocarbon radicals selected from linear and branched (C$_1$ to C$_{10}$) alkylene; divalent cyclic hydrocarbon radicals selected from substituted and unsubstituted (C$_3$ to C$_8$) cycloaliphatic moieties of the formula:

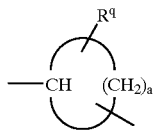

wherein "a" is an integer from 2 to 7 and R$^q$ if present represents linear and branched (C$_1$ to C$_{10}$) alkyl groups; divalent oxygen containing radicals selected from (C$_2$ to C$_{10}$) alkylene ethers and polyethers of the formula:

wherein x is an integer from 1 to 5 and y is an integer from 2 to 50, with the proviso that the terminal oxygen atom on the polyether spacer moiety can not be directly linked to a terminal oxygen atom on an adjacent group to form a peroxide linkage; and divalent cyclic ethers and cyclic diethers represented by the structures:

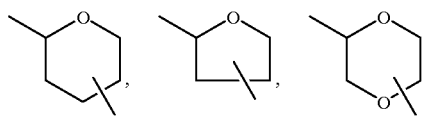

n is 0 or 1; and R* is acid labile group selected from Dcpm, Dmcp, —C(CH$_3$)$_3$, —CH(R$^P$)OCH$_2$CH$_3$, —CH(R$^P$)OC(CH$_3$)$_3$ and the cyclic group:

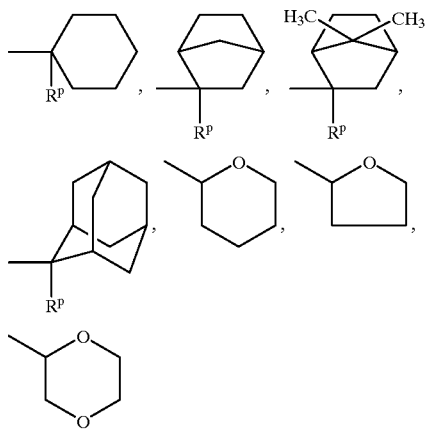

or mixtures thereof, wherein R$^P$ represents hydrogen and a linear or branched (C$_1$ to C$_5$) alkyl group.

9. The polymer of claim 8 further comprising repeating units selected from one or more of the structures represented as follows:

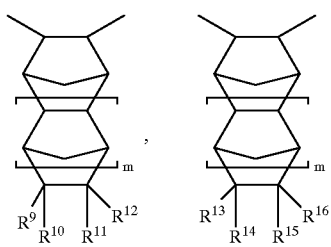

wherein R$^9$ to R$^{12}$ independently represent hydrogen, linear or branched (C$_1$ to C$_{10}$) alkyl, or a substituent selected from the group —(A)$_n$—C(O)OR", —(A)$_n$—OR", —(A)$_n$—OC(O)R", —(A)$_n$—OC(O)OR", —(A)$_n$—C(O)R", —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$, R$^9$ and R$^{12}$ can be taken together with the ring carbon atoms to which they are attached to represent a cyclic anhydride group; A and A' independently represent a divalent bridging or spacer radical selected from divalent hydrocarbon radicals selected from linear and branched (C$_1$ to C$_{10}$) alkylene; divalent cyclic hydrocarbon radicals selected from substituted and unsubstituted (C$_3$ to C$_8$) cycloaliphatic moieties of the formula:

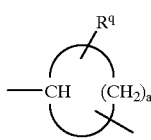

wherein "a" is an integer from 2 to 7 and R$^q$ if present represents linear and branched (C$_1$ to C$_{10}$) alkyl groups; divalent oxygen containing radicals selected from (C$_2$ to C$_{10}$) alkylene ethers and polyethers of the formula:

wherein x is an integer from 1 to 5 and y is an integer from 2 to 50, with the proviso that the terminal oxygen atom on the polyether spacer moiety can not be directly linked to a terminal oxygen atom on an adjacent group to form a peroxide linkage; and divalent cyclic ethers and cyclic diethers represented by the structures:

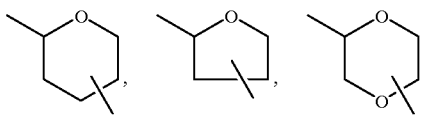

n is 0 or 1; R" independently represents, linear and branched ($C_1$ to $C_{10}$) alkyl, linear and branched ($C_1$ to $C_{10}$) alkoxyalkylene, polyethers, monocyclic and polycyclic ($C_4$ to $C_{20}$) cycloaliphatic moieties, cyclic ethers, cyclic ketones, and cyclic esters; and $R^{13}$ to $R^{16}$ independently represent hydrogen and linear and branched ($C_1$ to $C_{10}$) alkyl; and m is an integer from 0 to 5.

10. The polymer of claim 1 comprising a repeating unit of the structure:

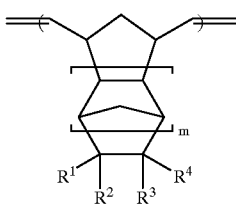

wherein $R^1$ to $R^4$ independently represent hydrogen, —(CH$_2$)C(O)OR, wherein R is hydrogen or linear and branched ($C_1$ to $C_{10}$) alkyl and at least one of $R^1$ to $R^4$ is an aromatic containing substituent selected from the group consisting of —G, —(CH$_2$)$_n$G, —C(O)O(CH$_2$)$_n$G, —C(O)NH(CH$_2$)$_n$G, —(CH$_2$)$_n$OG, —(CH$_2$)$_n$OC(O)O(CH$_2$)$_n$G, and —(CH$_2$)$_n$NHC(O)G; m is an integer of 0 to 5; n independently represents an integer of 0 to 5; and G is an aromatic group substituted with at least one substituent selected from the group consisting of —OR$^{14}$, R$^{15}$, and combinations thereof, wherein $R^{14}$ represents hydrogen, linear and branched ($C_1$ to $C_{10}$) alkyl, —C(O)CH$_3$, tetrahydropyranyl, t-butyl; $R^{15}$ represents hydrogen, bromine, chlorine, fluorine, iodine, cyano, and the group —C(O)O-t-butyl; $R^1$ and $R^4$ together with the two ring carbon atoms to which they are attached can form a substituted aromatic group of 6 to 14 carbon atoms wherein said substituents are selected from at least one moiety of the formulae —OR$^{14}$ or R$^{15}$ as defined above; $R^1$ and $R^4$ together with the two ring carbon atoms to which they are attached can also form a 5 membered heterocyclic group containing at least one heteroatom wherein the heteroatom is substituted with G as defined above.

11. The polymer of claim 10 further comprising a repeating unit represented by the structure:

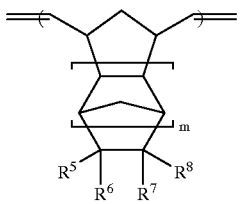

wherein $R^9$ to $R^{12}$ independently represent hydrogen, linear or branched ($C_1$ to $C_{10}$) alkyl, or a substituent selected from the group —(A)$_n$—C(O)OR", —(A)$_n$—OR", —(A)$_n$—OC(O)R", —(A)$_n$—OC(O)OR", —(A)$_n$—C(O)R", —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$, $R^9$ and $R^{12}$ can be taken together with the ring carbon atoms to which they are attached to represent a cyclic anhydride group; A and A' independently represent a divalent bridging or spacer radical selected from divalent hydrocarbon radicals selected from linear and branched ($C_1$ to $C_{10}$) alkylene; divalent cyclic hydrocarbon radicals selected from substituted and unsubstituted ($C_3$ to $C_8$) cycloaliphatic moieties of the formula:

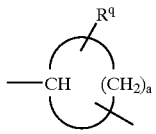

wherein "a" is an integer from 2 to 7 and $R^q$ if present represents linear and branched ($C_1$ to $C_{10}$) alkyl groups; divalent oxygen containing radicals selected from ($C_2$ to $C_{10}$) alkylene ethers and polyethers of the formula:

wherein x is an integer from 1 to 5 and y is an integer from 2 to 50, with the proviso that the terminal oxygen atom on the polyether spacer moiety can not be directly linked to a terminal oxygen atom on an adjacent group to form a peroxide linkage; and divalent cyclic ethers and cyclic diethers represented by the structures:

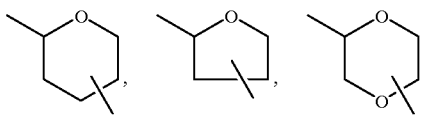

n is 0 or 1; R" independently represents, linear and branched ($C_1$ to $C_{10}$) alkyl, linear and branched ($C_1$ to $C_{10}$) alkoxyalkylene, polyethers, monocyclic and polycyclic ($C_4$ to $C_{20}$) cycloaliphatic moieties, cyclic ethers, cyclic ketones, and cyclic esters; and $R^{13}$ to $R^{16}$ independently represent hydrogen and linear and branched ($C_1$ to $C_{10}$) alkyl; and m is an integer from 0 to 5.

12. The polymer of claim 11 further comprising repeating units selected from one or more of the structures represented as follows:

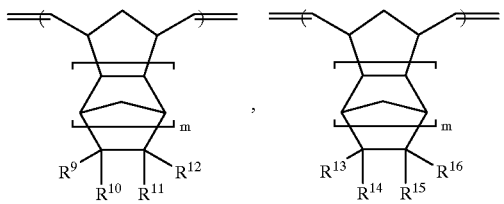

wherein $R^9$ to $R^{12}$ independently represent hydrogen, linear or branched ($C_1$ to $C_{10}$) alkyl, or a substituent selected from the group —$(A)_n$—C(O)OR", —$(A)_n$—OR", —$(A)_n$—OC(O)R", —$(A)_n$—OC(O)OR", —$(A)_n$—C(O)R", —$(A)_n$—OC(O)C(O)OR", —$(A)_n$—O—A'—C(O)OR", —$(A)_n$—OC(O)—A'—C(O)OR", —$(A)_n$—C(O)O—A'—C(O)OR", —$(A)_n$—C(O)—A'—OR", —$(A)_n$—C(O)O—A'—OC(O)OR", —$(A)_n$—C(O)O—A'—O—A'—C(O)OR", —$(A)_n$—C(O)O—A'—OC(O)C(O)OR", —$(A)_n$—C(R")$_2$CH(R")(C(O)OR"), and —$(A)_n$—C(R")$_2$CH(C(O)OR")$_2$, n is 0 or 1; $R^9$ and $R^{12}$ can be taken together with the ring carbon atoms to which they are attached to represent a cyclic anhydride group; A and A' independently represent a divalent bridging or spacer radical selected from divalent hydrocarbon radicals selected from linear and branched ($C_1$ to $C_{10}$) alkylene; divalent cyclic hydrocarbon radicals selected from substituted and unsubstituted ($C_3$ to $C_8$) cycloaliphatic moieties of the formula:

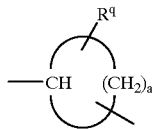

wherein "a" is an integer from 2 to 7 and $R^q$ if present represents linear and branched ($C_1$ to $C_{10}$) alkyl groups; divalent oxygen containing radicals selected from ($C_2$ to $C_{10}$) alkylene ethers and polyethers of the formula:

$$-(CH_2(CH_2)_xO)_y-$$

wherein x is an integer from 1 to 5 and y is an integer from 2 to 50, with the proviso that the terminal oxygen atom on the polyether spacer moiety can not be directly linked to a terminal oxygen atom on an adjacent group to form a peroxide linkage; and divalent cyclic ethers and cyclic diethers represented by the structures:

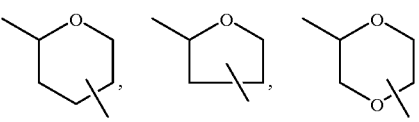

R" independently represents, linear and branched ($C_1$ to $C_{10}$) alkyl, linear and branched ($C_1$ to $C_{10}$) alkoxyalkylene, polyethers, monocyclic and polycyclic ($C_4$ to $C_{20}$) cycloaliphatic moieties, cyclic ethers, cyclic ketones, and cyclic esters; and $R^{13}$ to $R^{16}$ independently represent hydrogen and linear and branched ($C_1$ to $C_{10}$) alkyl; and m is an integer from 0 to 5.

13. The composition of claim 4 further comprising a monomer selected from the group consisting of maleic anhydride, $SO_2$, and mixtures thereof.

* * * * *